United States Patent [19]

Hiraki et al.

[11] Patent Number: 5,485,418

[45] Date of Patent: Jan. 16, 1996

[54] ASSOCIATIVE MEMORY

[75] Inventors: Toshiyuki Hiraki; Masayuki Hata, both of Hyogo, Japan

[73] Assignee: Mitsubishi Denki Kabushiki Kaisha, Tokyo, Japan

[21] Appl. No.: 887,272

[22] Filed: May 21, 1992

Related U.S. Application Data

[63] Continuation-in-part of Ser. No. 641,986, Jan. 16, 1991, abandoned.

[30] Foreign Application Priority Data

Jan. 16, 1990 [JP] Japan ............................ 2-7592

[51] Int. Cl.$^6$ ................................................ G11C 15/00
[52] U.S. Cl. ................ 365/49; 365/230.03; 365/230.08; 365/205; 365/210
[58] Field of Search ................................ 365/49, 230.03, 365/230.08, 200.205

[56] References Cited

U.S. PATENT DOCUMENTS

| | | | |
|---|---|---|---|
| 4,163,288 | 7/1979 | Vinot | 365/49 |
| 4,622,653 | 11/1986 | McElroy | 365/230.03 |
| 4,675,849 | 6/1987 | Kinoshita | 365/230 |
| 4,744,053 | 5/1988 | Luhrmann | 365/49 |
| 4,811,303 | 3/1989 | Hirai | 365/230.08 |
| 4,833,642 | 5/1989 | Ooi | 365/49 |
| 4,959,811 | 9/1990 | Szczepanek | 365/49 |
| 4,972,374 | 11/1990 | Wang et al. | 365/205 |

FOREIGN PATENT DOCUMENTS 62-267997  11/1987  Japan .

Primary Examiner—Eugene R. LaRoche
Assistant Examiner—Huan Hoang
Attorney, Agent, or Firm—Townsend and Townsend Khourie and Crew

[57] ABSTRACT

An associative memory comprises a CAM array which is divided into a plurality of blocks, block select means, decoder means, and output means. The associative memory receives an externally supplied input address having first, second, and third parts. Which entry row in the CAM should be compared with the first part (TAG address) of the input address is determined by the second and third parts of the input address. The block select means responsive to the second part of the input address selects a block in the CAM. The decoder means responsive to the third part of the input address selects one out of a plurality of entry rows in the selected block. A comparison operation is carried out in each of the entry rows in the selected block. Since not all the entry rows are selected for comparison operations, power consumption can be reduced.

8 Claims, 8 Drawing Sheets

ASSOCIATIVE MEMORY

CROSS RELATED REFERENCES TO OTHER APPLICATIONS

This is a continuation in part of application Ser. No. 07/641,986 filed Jan. 16, 1991, abandoned.

BACKGROUND OF THE INVENTION

1. Field of the Invention

The present invention relates to an associative memory, and in particular to have comparison function of storage of data, stored data and data input from outside.

2. Description of the Prior Art

Conventional memory reads and writes the data by means of applying address. On the contrary, associative memory can compare in parallel read and write of data, input retrieval data and the entire stored data. It is typically as comparison function of associative memory to give judgement whether retrieval data agrees with stored data or not, and also it is possible for skilled persons in prior art to judge the relationship thereof.

Such a comparison is applied when it give the judgement of which cache hit or miss hit in cache memory.

If coincidence detecting function of this associative memory is composed in use of general memory, another data comparator is required, in order to make comparison operation, data stored in memory is read once, comparison of read data and retrieval data must be made by said comparator. That is, comparison operation of associative memory has advantage which can act more high-speed than comparison operation of system which made use of memory and comparator.

Now, an associative memory in prior art will be described according to appended drawings of FIG. 6 to FIG. 8.

FIG. 6 is a general diagram of a typical Content Addressable Memory (hereinafter called CAM).

As shown in FIG. 6, numeral (1) is a buffer register which stores retrieval data (1a), numeral (2) is a CAM cell (Content Addressable Memory cell) having function which can store data and compare the data content, numeral (3) is CAM array (Content Addressable Memory array) in which the CAM cell (2) is arranged by ixj arrangement, numeral (4) is a data line communicating said retrieval data to the respective CAM cell (2), numeral (5) is a retrieval storing buffer register stored retrieved result, numeral (6) is a match line which detects compared result in the CAM cell (2) and communicates it to corresponding retrieval storage buffer register (5), numeral (7) is an entry area which composes of i-piece CAM cell (2) arranged in one direction arrangement in said CAM array (3) and is connected to the match line (6).

The said Content Addressable Memory is used in cache memory or data base and the like.

FIG. 7 is a structural example of the TAG memory applying the CAM.

Numeral (8) is a buffer register storing an input address (8a) which consists of p bit, numeral (9) is a partial buffer register storing a TAG address (9a) which composes of high order i bit of the input address (8a), numeral (10) is a partial buffer register storing an entry address (10a) which composes of low order p-i bit of the input address (8), numeral (11) is a sense amplifier which senses output level from match line (6), numeral (12) is a transmission gate (hereinafter call T.G.) which communicates the retrieved output of the match line (6) to the sense amplifier (11), numeral (13) is entry decoder for decoding said T.G. (12) by means of said entry address (10), numeral (14) is an entry signal line connecting output of said entry decoder (13) and gate input of said T.G. (12), numeral (15) is a bit line, numeral (16) is a negative logic bit line, numeral (17) is a driver which drives potential of said data line (4) and communicates it to said bit lines (15) and (16).

Next, the operation will be explained.

As shown in FIG. 7, in view of operation of comparison time in the TAG memory, p bit data is input into the input address buffer register (8) storing the input address (8a) from outside. i bit of the buffer register (9) of the TAG address (9a) which is a part of this input address (8a) is provided for a buffer register (1) and is communicated to corresponding bit lines (15) and (16) as retrieval data to pass the data line (4) via the driver (17).

Further, in the respective CAM cell (2), comparison of the TAG address communicated with the bit lines (15) and (16) and data stored in the CAM array (3) is made at the same time. This comparison operation is made over the entire area of the CAM array (3) by means of comparison function of the CAM cell (2). In view of the respective entry area (7), if all CAM cell (2) agree, the match line (6) of said entry area (7) is level which indicates agreement, for example, Hi-level. On the contrary, if there is disagreement of a bit in one entry area (7), the match line (6) of said entry area (7) is level which indicates disagreement or for instance, Low-level.

On the other hand the entry decoder (13) is decoded by binary numbers indicated with p-i bit from the entry address buffer register (10) which is a part of the input address, the output signal enables corresponding T.G. (12) to conduct through entry signal line (14) so that the entry area (7) can be selected.

Thereby, selected level of the match line (6) is communicated to the sense amplifier (11). This sense amplifier (11) senses the level and inputs agreement or disagreement. For example, since p-bit entry address composes of five bit, when "01011" is input, the entry decoder (13) conducts eleventh-T.G. 12-11 and selects eleventh-entry 7-11. When this eleventh-entry 7-11 is agreement, it is Hi-level, when said eleventh-entry 7-11 is disagreement, it is Low-level, thereby this level, sense amplifier (11) outputs agreement or disagreement of the selected entry area (7).

As shown in FIG. 8, said CAM cell (2) composes a general random access memory (RAM) element and three transistors. For example, when "1" of Hi-level is stored in said RAM element, in case that "0" of Low-level is retrieval data is input via the bit line (15) and "1" of Hi-level is input via the bit line (16), since the transistor of connected match line connected to said match line (6); and is on, the match line (6) is Low-level which indicates disagreement.

Moreover, when said retrieval data is "1" of Hi-level, said transistor is not on, thereby the match line (6) is kept in Hi-level which indicates agreement.

As the above mentioned, in all CAM cell (2) of the entry area (7), if it agrees with "1" of retrieval data, the match line (6) is kept in Hi-level, if it disagrees with "1" of retrieval data, the match line (6) is Low-level, the retrieved result in this entry area (7) can be provided.

Since a general associative memory is composed as the above described, when it is used in cache memory and the like, if there is locality in retrieved data, all entry area (7) must be compared with retrieval data "1" as object comparing the entire CAM array (3), and further because it takes time for retrieving and operation speed delays, there are problems that consumed electric current increases.

SUMMARY OF THE INVENTION

In view of such problems of the prior art, a primary object of the present invention is to provide an associative memory which can shorten retrieving time and increase operation speed and further save consumed electric current.

A second object of the present invention is to provide an associative memory that receives an externally supplied input address, with the input address including first, second, and third parts. The associative memory comprises a content addressable memory (CAM) array, block select means, decoder means, and output means. The CAM array is divided into a plurality of blocks, each of which includes a plurality of cells arranged in a plurality of rows and columns, each cell has means for comparing data stored therein with a corresponding portion of the first part of the input address. The block select means, which is responsive to the second part of the input address, selects a particular block from the CAM array. The decoder means, which is responsive to the third part of the input address, selects a row in the particular block. Finally, the output means, which is responsive to the block select means and the decoder means, provides a result from the comparison of the first part of the input address and data stored in the particular row of the particular block.

BRIEF DESCRIPTION OF THE DRAWINGS

Now, the present invention will be described hereinafter with reference to the appended drawings in which.

DETAILED DESCRIPTION OF THE PREFERRED EMBODIMENT

Figure 5:
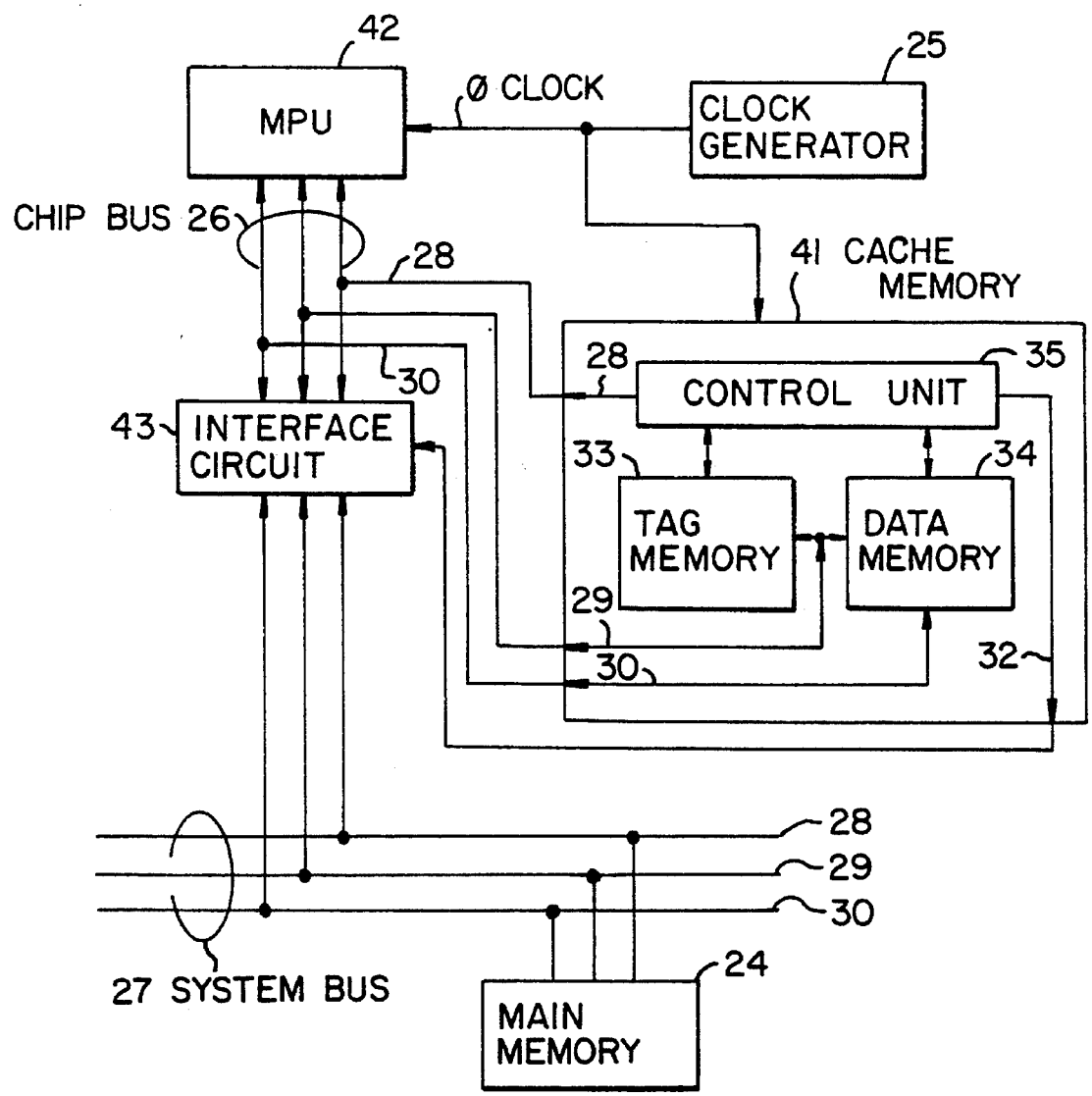
FIG. 5 is the entire configuration diagram illustrating an example applied TAG memory in accordance with the present invention to cache memory.
Figure 6:
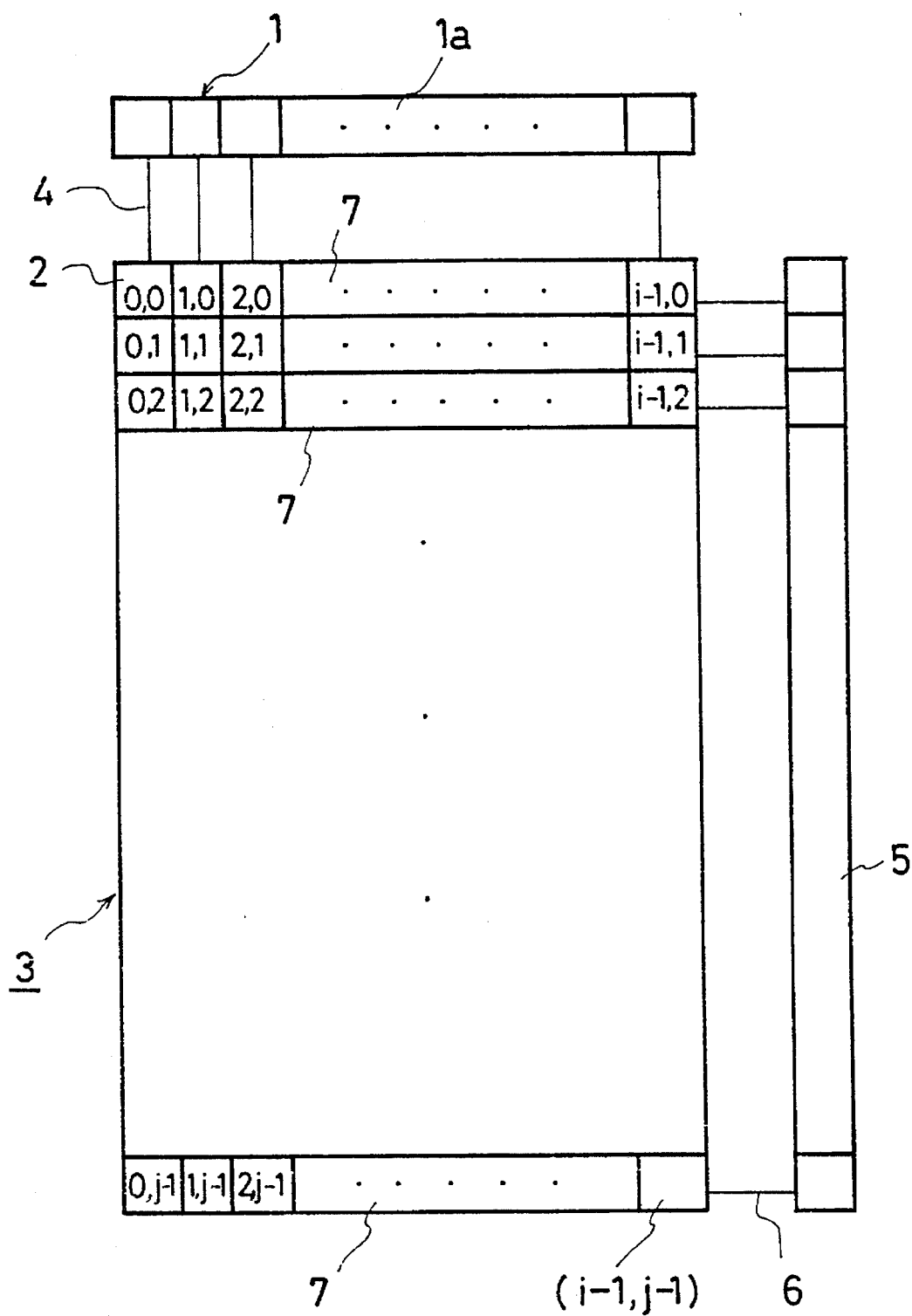
FIG. 6 is a general diagram of associative memory in prior art.
Figure 7:
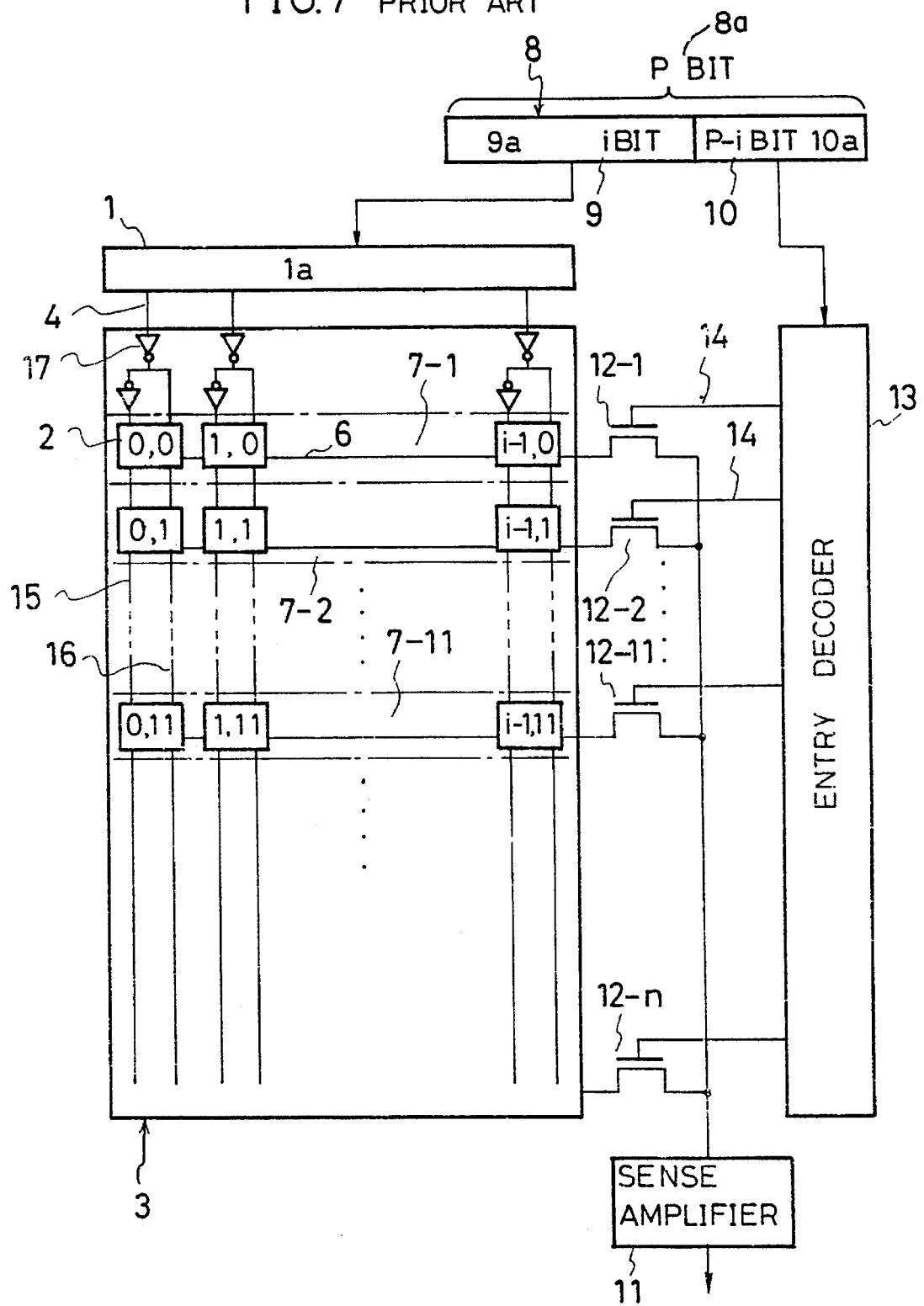
FIG. 7 is a block diagram illustrating configuration of the TAG memory applied associative memory in prior art.
Figure 8:
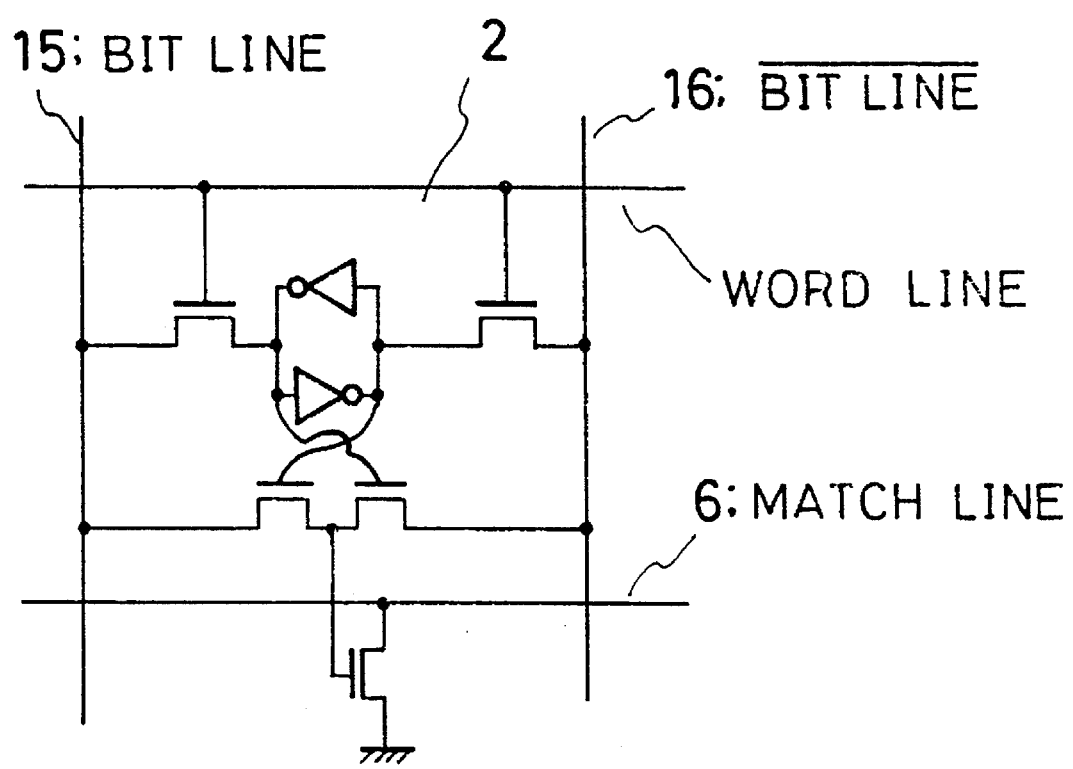
FIG. 8 is a partial circuit diagram of CAM cell of associative memory in the prior art.

FIG. 5 is a system structure diagram illustrating system applied associative memory in accordance with the present invention to a cache memory. As shown in FIG. 5, a cache memory (41) is connected in parallel to MPU (42) and a chip bus (26), the chip bus (26) is connected to a system bus (27) through an interface circuit (42).

The chip bus (26) and the system bus (27) are consisted of a plurality of control signal lines (28), an address bus (29) and a data bus (30), the system bus (27) is connected to a main memory (24). Also, a clock ($\phi$) is provided for said cache memory (41) and said MPU (42) from a clock generator (25). Further, when said cache memory (41) converts into a bus master in itself, it asserts an interface control signal (32) for controlling said interface circuit (43)

Said cache memory (41) comprises a TAG memory (33) for storing TAG address applied associative memory in accordance with the present invention, a data memory (34) for stored data, and a control unit (35) for controlling the entire system.

As seen in the system which is shown in FIG. 5, said cache memory (41) can fetch effective address being output into address bus (29) from MPU (42) when said cache memory (41) receives a read signal. This fetched address is communicated to said TAG memory (33) and said data memory (34). This TAG memory (33) can make comparison operation of the TAG address in a part of this input address with stored data for address.

The result, if said TAG address agrees with said stored data, in said cache memory (41) called cache hit, the data called from data memory (34) corresponding to input address is input into said data bus (30) and is fetched in the MPU (42). If said TAG address disagrees with said stored data, said cache memory (41) misses, called "Miss Hit", said main memory (24) is again accessed. In this moment, said cache memory (41) converts into bus master, signal of said chip bus (26) is communicated to system bus (27) via said interface circuit (43) by means of said interface control signal line (32).

Said main memory (24) can output the data which corresponds to the address signal into said data bus (30). The output data is communicated to said data bus (30) of said chip bus (26) through said interface circuit (43), and further the data is fetched for MPU (42) and said cache memory (41) at the same time. In this moment, said cache memory (41) writes corresponding TAG address in said TAG memory (33) and completes read operation.

Now, such a TAG memory (33) will be described hereinafter in detail with reference to FIG. 1 to FIG. 3.

Figure 1:
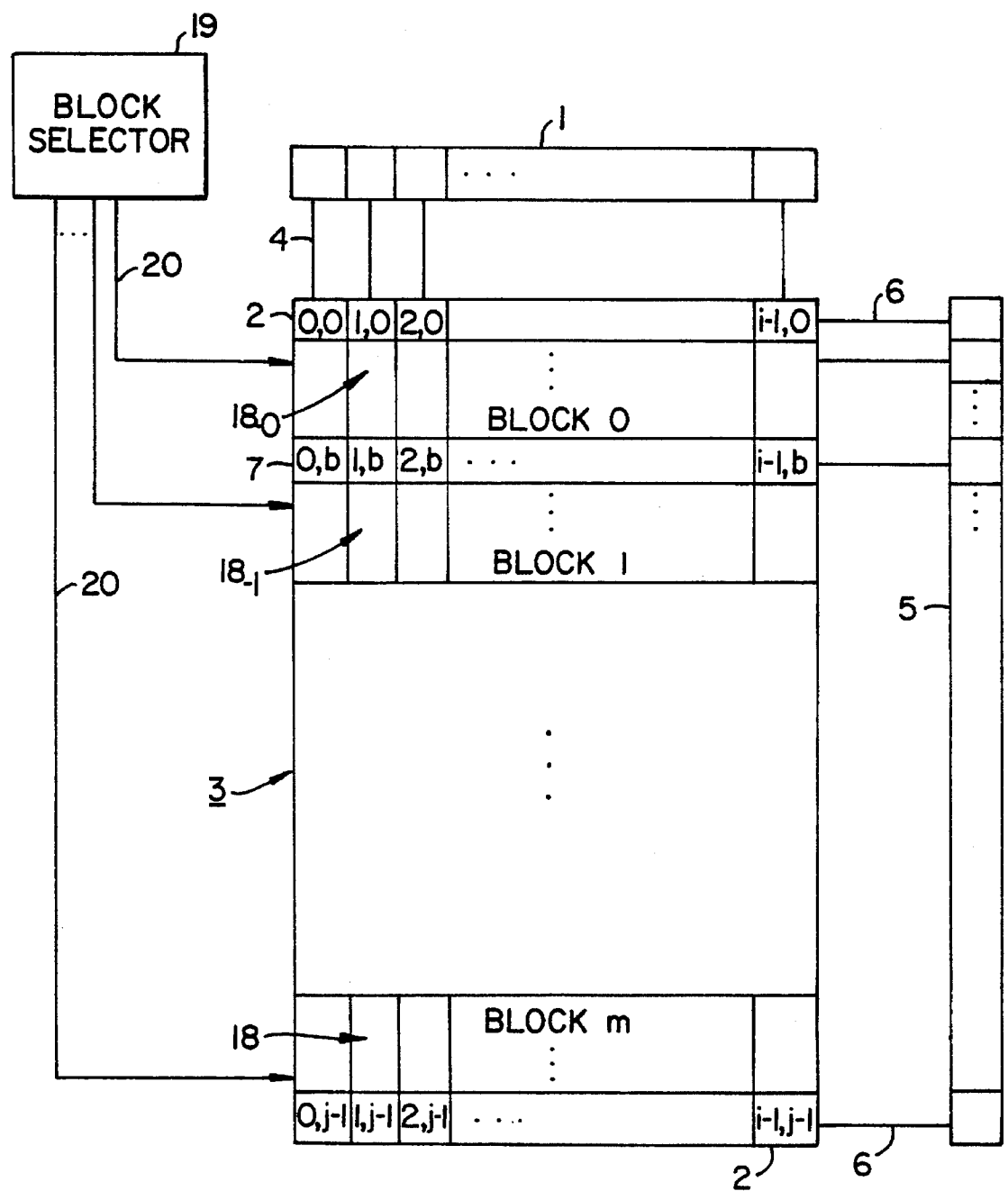
FIG. 1 is a general diagram illustrating an embodiment of the present invention.

As shown in FIG. 1, numeral (18) is respective block which partitioned CAM array (3) of iXj arrangement to bit line direction, or CAM cell (2) according to m-partition every entry area (7) of a plurality of one direction arrangement, numeral (19) is a block selector which selects one of m-blocks (18), numeral (20) is a block select signal line connected to said block (18) corresponding to output of said block selector (19). The said CAM such as described in the above makes comparison of one block (18) selected by said block selector (19) with retrieved data from buffer register (1), other blocks (18) are not compared with retrieved data.

Figure 2:
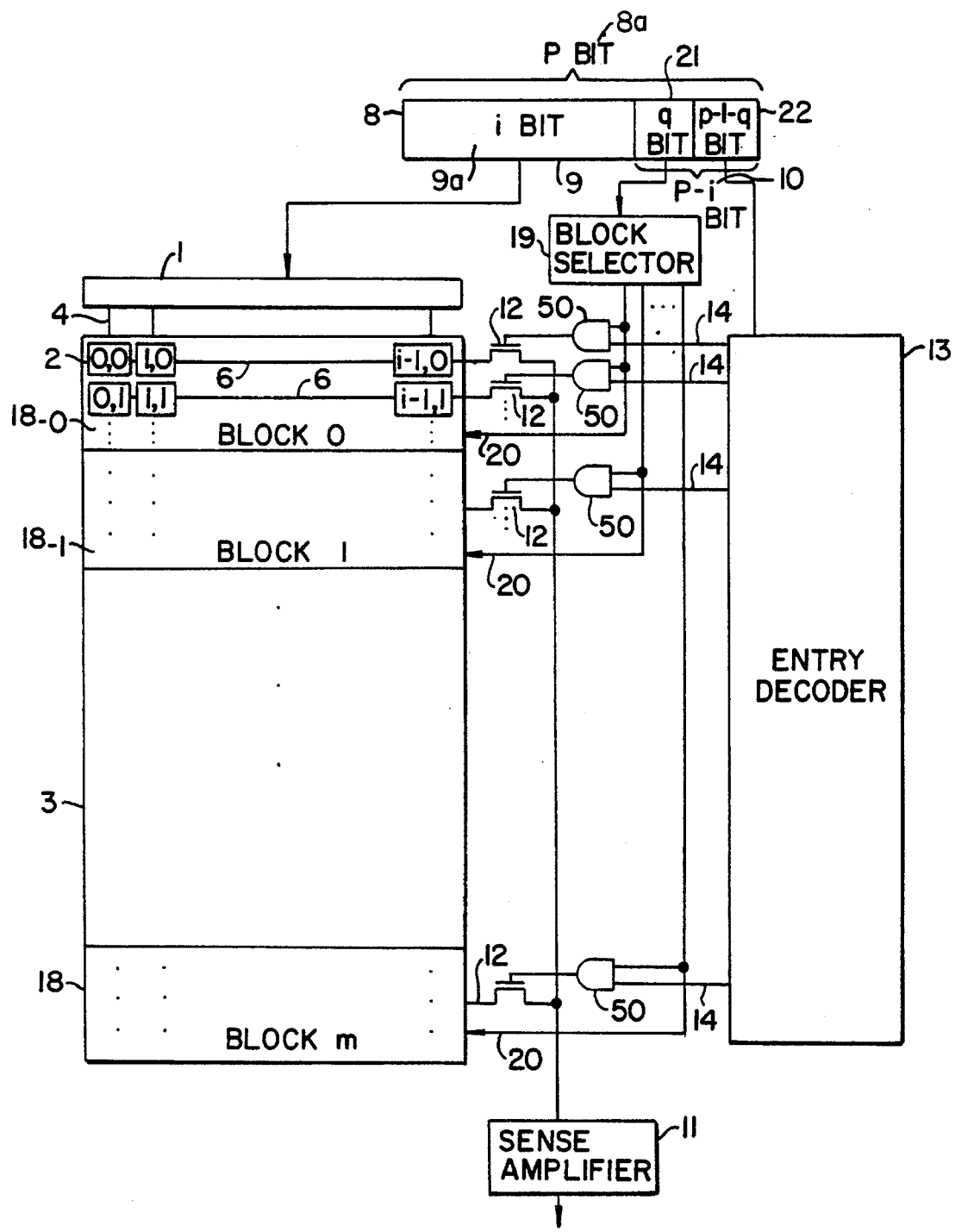
FIG. 2 is a block diagram illustrating configuration of TAG memory applied associative memory in accordance with the present invention.

FIG. 2 is a structural example of said TAG memory (33) applied said CAM, as shown in FIG. 2, partial buffer register (21) stores block address which consists of high order q bit in p-i bit entry address, another partial buffer register (22) stores partition entry address which consists of low order p-i-q bit of said entry address. Numeral (50) is an AND circuit for making a logical product of an output signal from the entry decoder (13) and an output signal from the block selector (19), and its output is inputted to the gate of the T.G. (12). Said q bit block select address is communicated to said block selector (19), p-i-q bit partition entry address is communicated to entry decoder (13). For example, if said p-i bit entry address consists of five bits, said q bit block select address consists of two bits and p-i-q bit partition entry address consists of three bits, in case which said block select address is "01", the second block (18-1) is selected. In addition, said decoder (13) is composed so that nth entry signal line (14) in each block (18) is made active by the partial buffer register (22), and the T.G. (12) is turned on by the AND circuit (50) to which a signal from the entry signal line (14) and a signal from the block select signal line (20)

are inputted. For example, when the second block (18-1) is selected and the partial buffer register (22) is "101", the sixth-T.G. (12) in the second block (18-1) is turned on.

Figure 3:
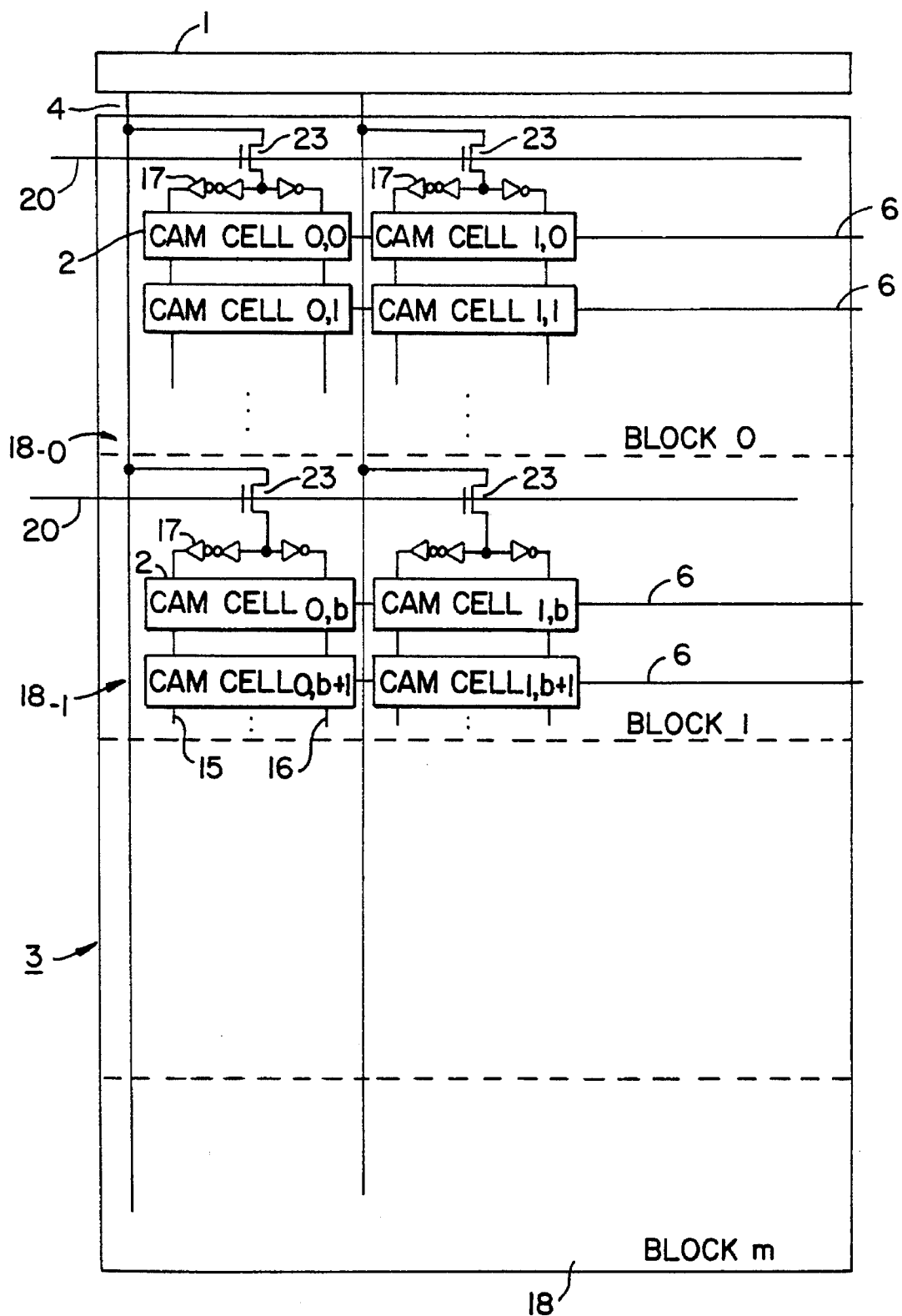
FIG. 3 is a partial circuit diagram of FIG. 2.

FIG. 3 is a diagram illustrating detail configuration of said block (18) as shown in FIG. 2.

Numeral (23) is block select T.G for selecting the respective corresponding block (18), block select signal (20) is connected in the gate of said block select T.G (23) and one terminal thereof is connected to retrieval data line (4), the other is connected to input of a driver (17).

Figure 4:
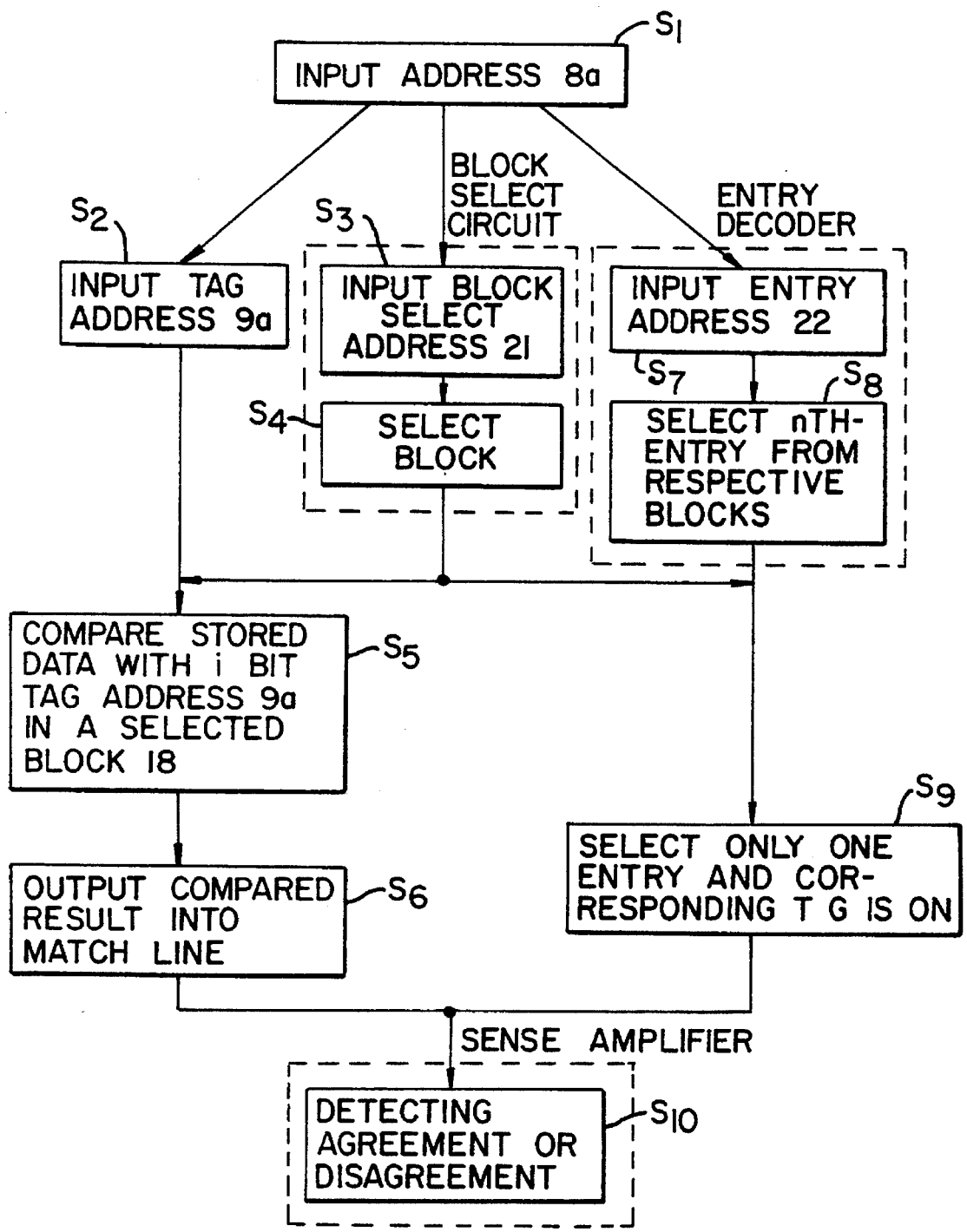
FIG. 4 is a flow chart illustrating operation in accordance with the present invention.

Next, operation will be described with reference to the flow chart shown in FIG. 4.

At first, in view of step S1, p bit address (8a) is input. Further, in said TAG memory (33), i bit TAG address (9a) of a part of p bit input address (8a) in step S2 is communicated to data line (4) as retrieval data from buffer register (1). In view of step S3, at the same time, q bit of block select address (21) which is a part of p bit input address (8a) is communicated to said block selector (19). This block selector (19) can select a corresponding signal line (20) from one of 0 to m of q bit block select address (21) in step S4, selected signal is output from this signal line (20). This selected signal enables said block select T.G (23) to be conductive condition via block select signal line (20), thereby i bit TAG address (9a) provided in said data line (4) in step S5 is communicated to bit lines (15) and (16) divided through said driver (17). At this time, said block select T.G (23) of which block (18) is not selected is non-conductive condition, therefore, i bit TAG address (9a) provided said data line (4) is not communicated.

Now, in view of CAM cell selected block (18), it is made to compare stored data with i bit TAG address (9a) communicated to divided bit lines (15) and (16). This comparison can be made by means of comparison function of the CAM cell. In view of step S6, if respective entry area (7) in selected block (18) agrees with the entire CAM cell (2), the match line (6) of said entry area (7) is kept level indicated agreement, that is, Hi-level. On the contrary, if there is disagreement of one CAM cell (2) in one entry area (7), said match line (6) of the entry area (7) is level indicated disagreement, that is, Low-level.

On the other hand, in view of step S7, p-i-q bit partition entry address (22) which is a part of p-i bit entry address (10) is communicated to the entry decoder (13) and is decoded in stage of step S8. An output signal from the entry decoder (13) and an output signal from the block selector (19) are inputted to the AND circuit (50), and the T.G. (12) becomes normal stage and the entry area (7) is selected in stage of step S9. Thereby level of the match line (6) for selected entry area (7) is communicated to the sense amplifier (11), said sense amplifier (11) senses the level in stage of step S10 and outputs agreement and disagreement signals.

In addition, in accordance with the present embodiments, one select signal line can be selected by select signal from said block selector (19), and corresponding select T.G (23) can be conducted, and i bit retrieval data is communicated to bit lines (15) and (16) from said buffer register (1). However, the present invention is not limited by the above description, it is possible to communicate to bit lines (15) and (16) via logical circuit of product or sum and the like of select signal and retrieval data.

Moreover, in the above described embodiment, it is described about the case which CAM is applied in TAG memory, but it can obtain similar advantage in another memory.

As has been described in the above, with the present invention, since associative memory is partitioned in respective block and can select part for retrieving by means of block select means, thereby it is good to compare only retrieved data in this selected data, therefore, time for retrieving shortens and operation speed is speedy and further consumption electric current is decreased.

Although the present invention has been described in term of specific embodiments, it is possible to modify and alter details thereof without departing from the spirit of the present invention.

What is claimed is:

1. An associative memory, comprising:

a content addressable memory array, responsive to a first part of an externally-supplied input address, for storing data, said content addressable memory array divided into a plurality of blocks, each of which includes a plurality of cells arranged in a plurality of rows and columns, each said cell having means for comparing data stored therein with a corresponding portion of said first part of said externally-supplied input address;

block select means, coupled to said content addressable memory array and responsive to a second part of said externally-supplied input address, for selecting a particular block from said content addressable memory array;

decoder means, coupled to said content addressable memory array and responsive to a third part of said externally-supplied input address, for selecting a particular row in said particular block; and output means, coupled to said content addressable memory array and responsive to said block select means and said decoder means, for providing a comparison result between said first part of said externally-supplied input address and data stored in said particular row of said particular block.

2. An associative memory according to claim 1 further comprising:

a buffer memory, coupled to said content addressable memory array, for storing the first part of the input address and for providing the first part to said content addressable memory array.

3. An associative memory according to claim 2 further comprising:

a sense amplifier means, coupled to said output means, responsive to said comparison result, for detecting said comparison result.

4. An associative memory according to claim 3 further comprising:

a first partial buffer register, coupled to said buffer memory, for storing the first part of the input address and for providing the first part to said buffer memory;

a second partial buffer register, coupled to said block select means, for storing the second part of the input address and for providing the second part to said block select means; and a third partial buffer register, coupled to said decoder means, for storing the third part of the input address and for providing the third part to said decoder means.

5. An associative memory, comprising:

a content addressable memory array, responsive to a first part of an externally-supplied input address, for storing data, said content addressable memory array divided into a plurality of blocks, each said block including a plurality of cells arranged in a plurality of rows and columns, each said cell having means for comparing data stored therein with a corresponding portion of said first part of said externally-supplied input address;

a plurality of sets of producing means, each said set of producing means responsive to a first and second inputs, for producing a logic product signal of said first and second inputs, with each said set of producing means associated with a corresponding block in said content addressable memory array, and with each said producing means associated with a corresponding row in said content addressable memory array such that a particular row is enabled when said logic product signal produced by a corresponding associated producing means is in an active state;

block selector, coupled to said plurality of sets of producing means, responsive to a second part of said externally-supplied input address, or providing a set of selecting signals which includes a group of first selecting signals provided to said first inputs of a particular set of producing means associated with a particular block and a second selecting signal provided to enable said particular block, wherein said comparing means stored in each row of said particular block is enabled to compare data stored therein with said first part of said externally-supplied input address;

a plurality of providing means, coupled to said content addressable memory array, each responsive to a corresponding logic product signal, for providing a comparison result from an associated row; and a decoder, coupled to said plurality of sets of producing means, responsive to a third part of said externally-supplied input address, for providing a plurality of decoding signals to said second inputs of said plurality of sets of producing means, wherein only a comparison result from said particular row in said particular block is enabled by said second selecting signal.

6. An associative memory according to claim 5, further comprising:

a buffer memory, coupled to said content addressable memory array, for storing the first part of the input address and for providing the first part to said content addressable memory array.

7. An associative memory according to claim 6, further comprising:

a sense amplifier, coupled to said plurality of sets of producing means, responsive to said comparison result, for detecting said comparison result.

8. An associative memory according to claim 7, further comprising:

a first partial buffer register, coupled to said buffer memory, for storing the first part of the input address and for providing the first part to said buffer memory;

a second partial buffer register, coupled to said block selector, for storing the second part of the input address and for providing the second part to said block selector; and a third partial buffer register, coupled to said decoder, for storing the third part of the input address and for providing the third part to said decoder.

* * * * *